US012650908B1

(12) United States Patent
Mueller et al.

(10) Patent No.: US 12,650,908 B1
(45) Date of Patent: Jun. 9, 2026

(54) PARALLEL FAULT INJECTION BASED ON FUNCTIONAL INDEPENDENCE

(71) Applicant: Cadence Design Systems, Inc., San Jose, CA (US)

(72) Inventors: Joerg Mueller, Otterfing (DE); Christopher William Komar, Phoenix, AZ (US); Yogesh K. Goel, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 82 days.

(21) Appl. No.: 18/957,106

(22) Filed: Nov. 22, 2024

(51) Int. Cl.
*G06F 30/3308* (2020.01)
*G06F 11/26* (2006.01)
*G06F 30/33* (2020.01)

(52) U.S. Cl.
CPC ........ *G06F 11/261* (2013.01); *G06F 30/3308* (2020.01); *G06F 30/33* (2020.01)

(58) Field of Classification Search
CPC ..... G06F 11/261; G06F 30/3308; G06F 30/33
See application file for complete search history.

(56) References Cited

U.S. PATENT DOCUMENTS

| | | | |
|---|---|---|---|
| 6,993,764 B2 * | 1/2006 | Petrini | G06F 9/5066 |
| | | | 712/18 |
| 9,032,266 B2 * | 5/2015 | Chan | G06F 30/33 |
| | | | 714/741 |
| 10,908,203 B2 * | 2/2021 | Sun | G01R 31/086 |
| 11,080,444 B1 * | 8/2021 | Kumar | G06F 30/3308 |
| 11,341,012 B2 * | 5/2022 | Wilson, Jr. | G06F 11/0772 |
| 11,994,559 B2 * | 5/2024 | Balasubramanian | ... G06F 30/30 |
| 2002/0083116 A1 * | 6/2002 | Petrini | G06F 9/5066 |
| | | | 719/310 |
| 2008/0215925 A1 * | 9/2008 | Degenaro | G06F 11/263 |
| | | | 714/41 |
| 2025/0278544 A1 * | 9/2025 | Mazzawi | G06F 30/398 |

* cited by examiner

*Primary Examiner* — Justin R Knapp

(74) *Attorney, Agent, or Firm* — Schwegman Lundberg & Woessner, P.A.

(57) ABSTRACT

Various example embodiments provide for injecting multiple faults in parallel into a circuit design during fault simulation of the circuit design based on functional independence of the faults, where the fault injection and simulation may be performed as part of an electronic design automation (EDA) software system. According to various example embodiments, a structural analysis of a circuit design is performed to determine fault observability per strobe and the results of the analysis are used to determine independent fault groups for parallel injection during fault simulation of the circuit design.

20 Claims, 5 Drawing Sheets

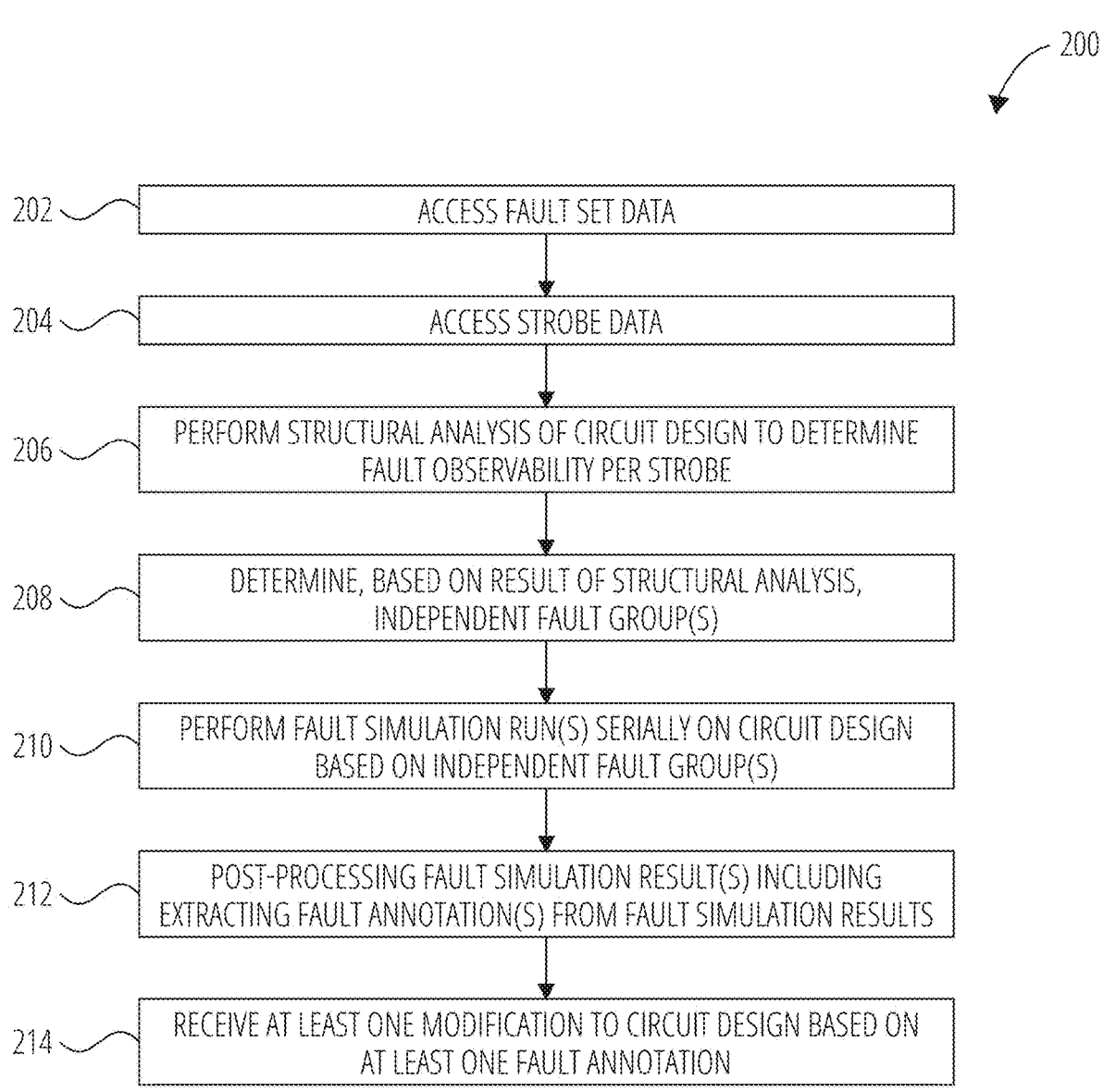

202 — ACCESS FAULT SET DATA

204 — ACCESS STROBE DATA

206 — PERFORM STRUCTURAL ANALYSIS OF CIRCUIT DESIGN TO DETERMINE FAULT OBSERVABILITY PER STROBE

208 — DETERMINE, BASED ON RESULT OF STRUCTURAL ANALYSIS, INDEPENDENT FAULT GROUP(S)

210 — PERFORM FAULT SIMULATION RUN(S) SERIALLY ON CIRCUIT DESIGN BASED ON INDEPENDENT FAULT GROUP(S)

212 — POST-PROCESSING FAULT SIMULATION RESULT(S) INCLUDING EXTRACTING FAULT ANNOTATION(S) FROM FAULT SIMULATION RESULTS

214 — RECEIVE AT LEAST ONE MODIFICATION TO CIRCUIT DESIGN BASED ON AT LEAST ONE FAULT ANNOTATION

302 — FAULT SET DATA

304 — FAULT GROUPING PROCESS

306 — FAULT INJECTION LIST WITH INDEPENDENT FAULT GROUPS

308 — SERIAL PARALLEL FAULT INJECTION ENGINE

310 — POST-PROCESSING WITH RESULT EXTRACTION

312 — FAULT ANNOTATION DATA

PARALLEL FAULT INJECTION BASED ON FUNCTIONAL INDEPENDENCE

TECHNICAL FIELD

Example embodiments described herein relate to circuit designs and, more particularly, to systems, methods, devices, and instructions for injection of multiple faults in parallel into a circuit design during fault simulation of the circuit design (e.g., of an integrated circuit) based on functional independence of the faults, where the fault injection and simulation may be performed as part of an electronic design automation (EDA) software system (e.g., safety analysis or functional safety verification (FSV) process thereof).

BACKGROUND

Generally, safety analysis methods have the objective to assess functionality of a system, such as a circuit, during the design phase (e.g., during development of a circuit design for the circuit) and ensure satisfactory safety levels. For example, functional safety is usually a fundamental requirement in automotive systems that ensures a tolerable level of risk with respect to their operation. To this end, failure mode analysis, such as failure modes and effects and diagnostic analysis (FMEDA), is often used to test how potential failures (represented by failure modes) can affect the functionality of a system. FMEDA represents a key component of functional safety, is a structured quantitative approach to define failure modes, and provides a failure rate and diagnostic capabilities of a hardware component. Failure mode analysis can test a system for functional safety as defined by a safety standard, such as International Electrotechnical Commission (IEC) 61508 for "Functional Safety of Electrical/Electronic/Programmable Electronic Safety-related Systems" and International Organization for Standardization (ISO) 26262 for functional safety of electrical and/or electronic systems in production automobiles. Safety can be measured by metrics calculated by the failure mode analysis (e.g., FMEDA).

BRIEF DESCRIPTION OF THE DRAWINGS

Various appended drawings merely illustrate some example embodiments of the present disclosure and should not be considered as limiting its scope. In the drawings, which are not necessarily drawn to scale, like numerals may describe similar components in different views. To easily identify the discussion of any particular element or act, the most significant digit or digits in a reference number refer to the figure number in which that element is first introduced.

FIG. 2 is a flow chart illustrating an example method for injecting multiple faults in parallel into a circuit design during fault simulation of the circuit design based on functional independence of the faults, according to some example embodiments.

DETAILED DESCRIPTION

Figure 1:
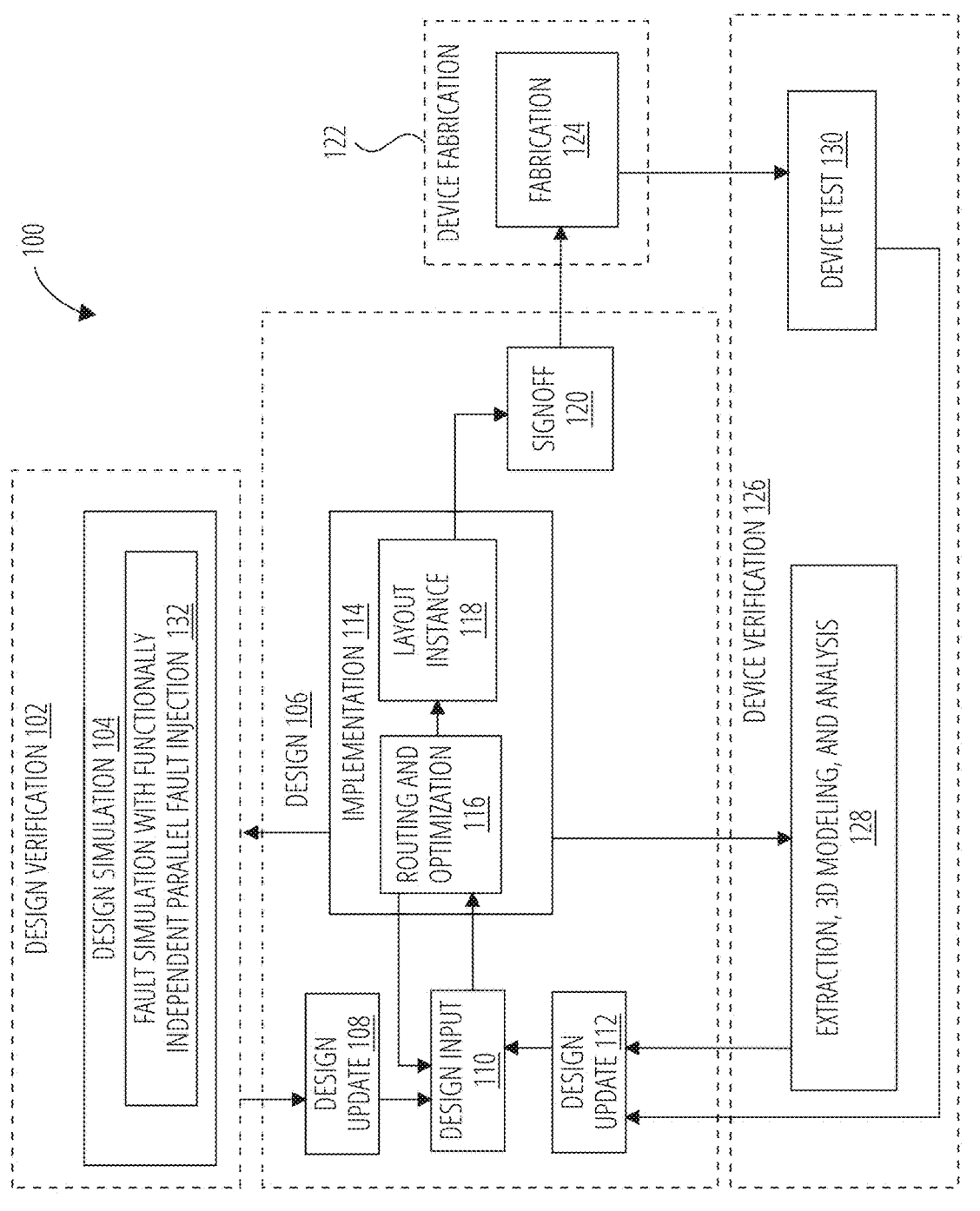
FIG. 1 is a diagram illustrating an example design process flow that includes injection of multiple faults in parallel during fault simulation of a circuit design based on functional independence of the faults, according to some example embodiments.

With respect to safety analysis (e.g., during functional safety verification (FSV)) of a circuit design (e.g., for integrated circuits (IC)), fault simulation and analysis are critical processes in the design and verification of the circuit design. As modern semiconductor designs grow increasingly complex, the number of potential faults that need to be simulated and analyzed has risen dramatically, often reaching into the millions or even billions for large-scale designs.

Fault simulation involves injecting faults into a circuit model and analyzing their effects on the system's behavior. There are two conventional approaches to fault simulation: concurrent fault simulation; and serial fault simulation. Concurrent fault simulation is often considered the best practice for injecting and analyzing thousands of faults quickly. While concurrent fault simulation allows for the simultaneous simulation of multiple faults (significantly reducing overall runtime compared to serial approaches), concurrent fault simulation has limitations. Certain design sizes or unsupported language constructs can prevent the use of concurrent fault simulation. In such cases, engineers currently resort to serial simulation or emulation techniques (e.g., use emulation when circuit design is too big to fit in a simulator to perform a serial simulation). Unfortunately, this shift introduces a new challenge: the long runtime associated with injecting and analyzing faults one at a time.

Serial fault simulation and emulation involve injecting faults one at a time into the circuit design and analyzing their effects. While this approach is more flexible and can handle a wider range of designs, it comes with a significant drawback: long runtimes. As the number of faults to be injected increases, the time required to complete the simulation or emulation process grows linearly, making it prohibitively time-consuming for designs with a large number of potential faults. The challenge of dealing with millions or billions of faults is particularly acute when running simulations serially. The time and computational resources required to process each fault individually can make comprehensive fault analysis impractical for complex designs.

Various example embodiments described herein provide for injection of multiple faults in parallel into a circuit design during fault simulation of the circuit design (e.g., of an integrated circuit) based on functional independence of the faults, where the fault injection and simulation may be performed as part of an electronic design automation (EDA) software system (e.g., safety analysis or FSV process thereof). According to various example embodiments, a structural analysis of a circuit design is performed to determine fault observability per strobe and the results of the analysis are used to determine (e.g., create or generate) independent fault groups for parallel injection during fault simulation of the circuit design, where all faults within a given independent fault group are functionally independent.

A structural analysis feature or process of a FSV application (e.g., of an EDA system) can be used to pre-determine if faults are functionally independent (e.g., faults can be injected and during fault simulation can determine fault observability per strobe of a circuit design, which is used to create independent fault groups for parallel injection during fault simulation of the circuit design. parallel without interfering with each other). Based on the determined independent fault groups, a fault simulation run can be performed on a circuit design for each independent fault group serially (e.g., one fault group at a time) such that all faults of a current independent fault group are injected in parallel during its associated fault simulation run.

Use of various example embodiments optimize fault simulation processes through intelligent fault grouping and parallel injection, which can address the bottleneck of serial processing of a large number of faults during a fault simulation and analysis of a circuit design. Some example embodiments efficiently generate one or more groups of independent faults in association with a circuit design to facilitate injection of multiple independent faults (of a given independent fault group) in parallel while retaining observability of the individual faults (within the given group) via the non-overlapping sets of strobes respectively associated with the independent faults. The observability of individual faults of a group of independent faults (via the non-overlapping sets of strobes respectively associated with the independent faults) during parallel injection of the independent faults can reduce (e.g., significantly reduce) the number of fault simulation runs (e.g., compared to conventional serial fault simulation). For example, for 10 faults, an example embodiment can reduce 10 fault simulation runs of a conventional serial fault simulation campaign of a circuit design to 5 fault simulation runs based on 5 independent fault groups. In particular, a serial fault simulation campaign of an example embodiment described herein can achieve the same level of fault simulation coverage as a conventional serial simulation campaign with a minimum number of fault simulation runs.

As used herein, a simulator can model operation of a circuit described by a circuit design using a software application. As used herein, emulation of a circuit design can comprise synthesizing the circuit design onto hardware (e.g., field programmable gate array (FPGA)) or one or more processors to model operation of a circuit described by the circuit design. Generally, emulation does not support concurrent testing of faults.

As used herein, a strobe comprises an observer point (or reference point), such as a signal or a timing event, used during fault simulation (e.g., performed as part of safety analysis or FSV) operation of a circuit design to sample, capture, or verify the state of a signal of a circuit described by the circuit design at a specific point in time (e.g., at a specific, predefined moment) during the operation of the circuit design. The data provided by a strobe can be used (e.g., by a safety engineer) to confirm that a functional safety standard applied to a circuit design is met. Data provided by a strobe can additionally, or alternatively, provide reactive changes to a test bench or circuit design in response to analysis/verification results. For example, a strobe can be used to detect failures (e.g., if data is not stable or valid when a strobe indicates it should be). A strobe can be used to indicate when a signal or a bus of a circuit design can be sampled. A strobe can be used to check the timing of signals in synchronous circuits (e.g., to ensure that the data on a bus or signal line of a circuit design is stable and correct when it needs to capture it).

As used herein, a cone-of-influence (COI) analysis can comprise a structural analysis technique of a circuit design that performs a functional analysis to gather one or more signals that are connected to a desired signal (e.g., output signal), including all signals and elements that influence or affect the desired signal. Additionally, a COI analysis can comprise a functional analysis to determine which signals or elements of a circuit design do not impact the desired signal. Various example embodiments use COI analysis to determine a node of a circuit design associated with a fault (e.g., fault node) has a physical connection to one or more strobes of interest. For various example embodiments, a node associated with a fault (e.g., fault node) outside the cone-of-influence has no physical connection to one or more strobes of interest and is considered safe.

As used herein, an activatability analysis can comprise a structural analysis technique performed on a circuit design to determine whether a given fault in a circuit design can be activated during operation. An activatability analysis can be used to determine whether particular a given fault can propagate through the circuit design and manifest as one or more observable errors (or whether they remain undetectable under normal operating conditions). For example, a SA0/1 fault injected on a node of a circuit design can be where a constant 0/1 cannot be activated in the circuit design. For some example embodiments, a fault that is unactivatable is considered a safe fault (e.g., independent fault). According to some example embodiments, the activatability analysis is used for constants in a circuit design, such as permanent faults (e.g., net is always 0 due to age or manufacturer fault). An activatability analysis can be used to determine whether a fault needs to be tested at all or whether a fault is constant.

As used herein, a propagatability analysis can comprise a structural analysis technique performed on a circuit design to determine whether a given fault that is activated and within a cone-of-influence can propagate to a strobe. Where a fault is activated and within a cone-of-influence but cannot propagate to a strobe, the fault can be considered unpropagatable and safe. The propagatability analysis can examine gates or a multiplexer (MUX) that prevents a fault from propagating (e.g., caused by constants in the design), which can shrink the strobe lists for each fault.

A circuit (e.g., IC) layout specifies portions of various components of an electronic device (e.g., IC device). To generate a circuit layout, an EDA software system can be used to design circuits by placing and routing circuit components based on design requirements. Using an EDA software system, digital logic portion of ICs or semiconductor chips can be designed as an interconnection of standard building blocks, usually referred to as standard-cells. Various example embodiments described herein can be used during fault simulation (e.g., performed as part of safety analysis or FSV) of a circuit design generated using an EDA software system.

Though various example embodiments are described herein with respect to injecting faults in parallel during a fault simulation of a circuit design, it will be understood that some example embodiments involve parallel injection of faults during a fault emulation (e.g., performed as part of safety analysis or FSV) of a circuit design, Reference will now be made in detail to various example embodiments of the present disclosure, examples of which are illustrated in the appended drawings. The present disclosure may, however, be embodied in many different forms and should not be construed as being limited to the examples set forth herein.

FIG. 1 is a diagram illustrating an example design process flow 100 for injecting multiple faults in parallel during fault simulation (e.g., performed as part of safety analysis or FSV) of a circuit design (e.g., of an integrated circuit) based on functional independence of the faults, according to some example embodiments. As shown, the design process flow 100 includes a design phase 106, a device fabrication phase 122, a design verification phase 102, and a device verification phase 126. The design phase 106 involves an initial design input 110 operation where the basic elements and functionality of a device are determined, and revisions are made based on various analyses and optimization of a circuit design. This design input 110 operation is where block instances are used in the circuit design and any additional circuitry for the design around the blocks is selected. The initial strategy, tactics, and context for the device to be created are also generated in the design input 110 operation, depending on the particular design algorithm to be used.

In some example embodiments, following an initial selection of design values in the design input 110 operation, routing, timing analysis, and optimization are performed in an implementation operation 114, which includes a routing and optimization 116 operation and generating a layout instance 118, along with any other automated design processes. Routing and optimization 116 may occur prior to the layout instance 118, and timing analysis, routing and optimization 116 may be performed at any time to verify operation of a circuit design. For instance, in various example embodiments, timing analysis in a circuit design may be performed prior to routing of connections in the circuit design, after routing, during register transfer level (RTL) operations, or as part of a signoff 120, as described below.

Though not shown, the routing and optimization 116 operation can include a clock tree synthesis (CTS) operation, which can generate one or more clock trees that deliver clock signal from clock sources of a circuit design to a plurality of clock tree leaf nodes comprising clock tree sinks (e.g., flip-flops) within the circuit design. The routing and optimization 116 operation may also include other operations not shown, such as those relating to floor-planning, placement, post-placement optimization, and post-routing optimization.

Design inputs are used in the design input 110 operation. These may be further processed during the design input 110 operation via a process, such as logic-synthesis to generate a circuit netlist mapped to a target standard library manufacturable by the foundry in fabrication operation 124. This netlist is placed by the layout instance 118 and optimized and routed by routing and optimization 116 operation, and a clock tree is inserted by CTS. Operations 116, and 118 may have a close interrelation and may be simultaneously optimized by processes similar to CCOPT. Prior to the routed, placed and optimized netlist being provided to a fabrication operation 124, the signoff 120 is performed on the circuit design defined by the layout.

After signoff verification by the signoff 120, a verified version of the layout is used in the fabrication operation 124 to generate a device, or additional testing and design updates may be performed using designer inputs or automated updates based on design simulation 104 operations or extraction, 3D modeling, and analysis 128 operations. Once the device is generated, the device can be tested as part of device test 130 operations, and layout modifications generated based on actual device performance.

As described in more detail below, a design update 108 from the design simulation 104 (performed during the design verification phase 102); a design update 112 from the device test 130 or the extraction, 3D modeling, and analysis 128 operations; or from the design input 110 operation may occur after the initial layout instance is generated by the layout instance 118 operation. In various example embodiments, whenever design inputs are used to update or change an aspect of a circuit design, a timing analysis and the routing and optimization 116 operation may be performed.

As shown, the design simulation 104 includes a fault simulation with functionally independent parallel fault injection 132 process (hereafter, fault simulation 132 process), which can implement (in the design process flow 100) inject multiple faults in parallel into a circuit design during fault simulation of the circuit design based on functional independence of the faults in accordance with various example embodiments. The fault simulation 132 process can be performed as part of a safety analysis process or FSV process performed on a circuit design.

FIG. 2 is a flowchart illustrating an example method 200 for injecting multiple faults in parallel into a circuit design during fault simulation of the circuit design based on functional independence of the faults, according to some example embodiments. It will be understood that example methods described herein can be performed by a device, such as a computing device executing instructions of an analysis (e.g., safety analysis or FSV) software system, in accordance with some example embodiments. Additionally, example methods described herein can be implemented in the form of executable instructions stored on a computer-readable medium or in the form of electronic circuitry. For instance, the operations of any one of method 200 of FIG. 2 can be represented by executable instructions that, when executed by a processor of a computing device, cause the computing device to perform the method. Depending on the embodiment, an operation of an example method described herein can be repeated in different ways or involve intervening operations not shown. Though the operations of example methods may be depicted and described in a certain order, the order in which the operations are performed may vary among embodiments, including performing certain operations in parallel. An operation of any of method 200 (or another method described herein) may be performed by a hardware processor (e.g., central processing unit or graphics processing unit) of a computing device (e.g., desktop, server, etc.). Depending on the embodiment, any method described herein can be used as part of a safety analysis or a FSV process being performed on a circuit design.

Referring now to FIG. 2, at operation 202, a hardware processor accesses fault set data that describes a set of faults (e.g., fault list) to be analyzed for (e.g., with respect) a circuit design. The set of faults can be less than all faults described by the fault set data. The faults selected for the set of faults can be those relevant or of particular interest for performing a safety analysis or FSV of the circuit design. For some example embodiments, the fault set data describes a fault node (e.g., fault injection point) in a circuit design for each fault in the set of faults. A fault node (e.g., fault injection point) for a given fault can correspond to a location (e.g., node) in the circuit design used to activate (e.g., inject, cause, or invoke) the given fault in the circuit design.

During operation 204, the hardware processor accesses strobe data describing a set of strobes for observing the circuit design. In particular, for some example embodiments, a given strobe (of the set of strobes) is used to observe the presence or the absence of one or more faults at a location (e.g., node) within the circuit design that corresponds to the strobe. For various example embodiments, the strobe data comprises a list of all strobes (e.g., observer points) within the circuit design.

For operation 206, the hardware processor performs a structural analysis of the circuit design to determine, for the set of faults (described by the fault set data), fault observability per strobe of the set of strobes. During the structural analysis, a fanout analysis (e.g., strobe fanout analysis) of one or more strobes (e.g., each strobe) of the set of strobes can be performed on the circuit design. For various example embodiments, the aim of the structural analysis is to determine, for each individual fault in the set of faults, a subset of strobes (or strobe subset) associated with (e.g., mapped to) the individual fault. Depending on the example embodiment, the structural analysis can comprise at least one of a cone-of-influence (COI) analysis, an activatability analysis, or a propagatability analysis. For some example embodiments, the structural analysis is performed using one or more features (e.g., COI analysis, activatability analysis, or propagatability analysis) implemented by a FSV software system. For a given strobe, the COI analysis can be used to determine one or more fault nodes, that correspond to one or more faults (e.g., in the set of faults) and that are outside a COI, which means those one or more fault nodes lack a physical connection to the given strobe. The activatability analysis can be used to determine which faults in the set of faults cannot be activated (e.g., because they are constantly 0 or 1). The propagatability analysis can be used to determine when a fault (in the set of faults) is unable to propagate to a given strobe despite the fault being activated and having an associated fault node that is within the COI of the given strobe. According to some example embodiments, the structure analysis comprises performing a COI analysis on the circuit design between each strobe in the set of strobes and each fault in the set of faults to determine associations between faults and strobes (e.g., determine which faults in the set of faults are in the COI of which strobes in the set of strobes). Additionally, for some example embodiments, the structure analysis comprises performing an activatability analysis to determine which faults in the set of faults cannot be activated and, therefore, not to be included in any independent fault group. For some example embodiments, the structure analysis comprises eventually performing a propagatability analysis to determine, for each association between a given strobe and a given fault within the given strobe's COI (as determined by the COI analysis), whether the given fault even propagates to the given strobe when the given fault is activated (e.g., injected, caused, or invoked); if the given fault does not propagate to the given strobe, the association between the given strobe and the given fault can be removed. According to various example embodiments, the result of the structural analysis comprises, for each individual fault in the set of faults, an association (e.g., mapping) between the individual fault and an individual subset of strobes of the set of strobes. An example result of the structural analysis is provided below in Table 1 for a set of faults (e.g., fault list) that comprises faults 1 through 10 ({1, 2, 3, 4, 5, 6, 7, 8, 9, 10}) and for a set of strobes that comprises a through d ({a, b, c, d}).

TABLE 1

| FAULT | ASSOCIATED STROBE SUBSET |
|-------|--------------------------|
| 1 | abcd |
| 2 | ab |

TABLE 1-continued

| FAULT | ASSOCIATED STROBE SUBSET |
|-------|--------------------------|
| 3 | c |
| 4 | d |
| 5 | abcd |
| 6 | abc |
| 7 | d |
| 8 | a |
| 9 | b |
| 10 | c |

At operation 208, the hardware processor determines (e.g., generates or identifies), based on a result of the structural analysis (of operation 206), a set of independent fault groups from the set of faults. According to various example embodiments, the set of independent fault groups are determined such that all faults within each individual independent fault group is injectable in parallel while each individual fault of the individual independent fault group remains independently observable by a subset of strobes of the set of strobes associated with the individual fault. In particular, for some example embodiments, the set of independent fault groups is determined such that for each individual independent fault group in the set of independent fault groups, each fault within the individual independent fault group has a strobe fanout that does not overlap with the strobe fanout of any other fault in the (same) individual independent fault group. In this way, faults of the set of faults are grouped into independent fault groups such that within each individual independent fault group, all faults are functionally independent with respect to each other. An example set of independent fault groups, determined based on the example result of the structural analysis of Table 1, is provided below in Table 2, where each fault in a given independent fault group is associated with a subset of strobes that does not overlap with the subset of strobes of any of the other faults in the given independent fault group.

TABLE 2

| INDEPENDENT FAULT GROUP | SET OF ASSOCIATED STROBE SUBSETS |
|-------------------------|----------------------------------|
| {1} | {abcd} |
| {2, 7, 10} | {ab, c, d} |
| {3} | {abcd} |
| {4, 6} | {abd, c} |
| {5, 8, 9} | {a, b, c} |

In Table 2, the first independent fault group comprises fault 1, which is observable by strobes a, b, c, and d. The second independent fault group comprises faults 2, 7, and 10, where fault 2 is observable by strobes a and b, where fault 7 is observable by strobe c, and where fault 10 is observable by strobe d. The third independent fault group comprises fault 3, which is observable by strobes a, b, c, and d. The fourth independent fault group comprises faults 4 and 6, where fault 4 is observable by strobes a, b, and d, and where fault 6 is observable by strobe c. The fifth independent fault group comprises faults 5, 8, and 9, where fault 5 is observable by strobe a, where fault 8 is observable by strobe b, and where fault 9 is observable by strobe c.

For operation 210, the hardware processor performs one or more fault simulation runs serially on the circuit design based on the set of independent fault groups. For various example embodiments, the one or more fault simulation runs are performed serially, with one simulation run being performed for each independent fault group of the set of independent fault groups. For example, the first simulation run can be performed with all faults in a first independent fault group injected in parallel (e.g., fault 1), the second simulation run can be performed with all faults in a first independent fault group injected in parallel (e.g., faults 2, 7, and 10), the third simulation run can be performed with all faults in a first independent fault group injected in parallel (e.g., fault 3), the fourth simulation run can be performed with all faults in a first independent fault group injected in parallel (e.g., faults 4 and 6), and the fifth simulation run can be performed with all faults in a first independent fault group injected in parallel (e.g., faults 5, 8, and 9). As described herein, in comparison to the conventional approach of serially performing one fault simulation run at a time for a single fault (e.g., for a list of 10 faults, serially performing 10 fault simulation runs—one fault simulation run for each fault), performing fault simulations runs performed serially based on the set of independent fault groups can result in fewer fault simulation runs than the conventional approach (e.g., for the list of 10 faults, the 10 faults can be grouped into 5 independent fault groups, which can result in serially performing 5 fault simulation runs—one fault simulation run for each independent fault groups).

For some example embodiments, operation 210 comprises performing at least a single fault simulation run on the circuit design for a single independent fault group of the set of independent fault groups. During the single fault simulation run, the hardware processor can perform a fault simulation on the circuit design and inject in parallel all faults from the single independent fault group while performing the fault simulation on the circuit design. Generally, each individual fault from an independent fault group is injected into a fault node (e.g., designated fault node) of the circuit design that is associated with (e.g., that corresponds to) the individual fault. While injecting all faults from the single independent fault group, the hardware processor can detect for (e.g., monitor or observe for) one or more faults (from the single independent fault group) at a single subset of strobes of the set of strobes, where the single subset of strobes is associated with the single independent fault group. During the detecting (e.g., monitoring or observing), one or more fault observations at the single subset of strobes can be stored (e.g., stored) as a result of the fault simulation. For various example embodiments, a fault simulation being performed for a given independent fault group does not terminate (e.g., stop) after a given fault of the given independent fault group is first detected at an associated strobe. For various example embodiments, the fault simulation continues to run (and detect for faults of the given independent fault group) until each select fault in the given independent fault group is observed at at least one strobe of a subset of strobes associated with the select fault. For some embodiments, this can be repeated for each of one or more independent fault groups (e.g., repeated for each independent fault group) in the set of independent fault groups. For example, after the single fault simulation run is performed on the circuit design (e.g., the single fault simulation run has completed), if there is a next independent fault group (of the set of independent fault groups) that still needs to be processed, the hardware processor can perform a next fault simulation run on the circuit design for the next independent fault group, where the hardware processor can perform the fault simulation on the circuit design again, inject in parallel all faults from the next independent fault group while performing the fault simulation on the circuit design, and (while injecting all faults from the next independent fault group) detect for one or more faults (from the next independent fault group) at a subset of strobes of the set of strobes associated with the next independent fault group.

During operation 212, the hardware processor performs post-processing of one or more fault simulation results from the one or more fault simulation runs. Depending on the example embodiment, a fault simulation result can comprise binary data, which can indicate whether (or not) individual faults are observed at one or more strobes. For various example embodiments, the post-processing includes extracting a set of fault annotations from the one or more fault simulation results. According to some example embodiments, the set of fault annotations describes whether one or more faults of the set of faults are observed at one or more strobes of the set of strobes during the one or more fault simulation runs. For instance, a given fault annotation can indicate whether or not fault 3 is observed at strobe b within an example circuit design.

Based on the set of fault annotations (extracted at operation 212), at operation 214, the hardware processor can receive, from a user (e.g., designer or a safety engineer), at least one modification to the circuit design. For example, the modification received from the user (e.g., via a graphical user interface) can modify (or debug) a node or a net of a circuit design (e.g., in view of a given fault being observed or not being observed at a given strobe within the circuit design). In the event that the set of fault annotations indicates that the circuit design is safe (e.g., the set of fault annotations contains no unsafe annotations), no modification of the circuit design is performed.

Figure 3:
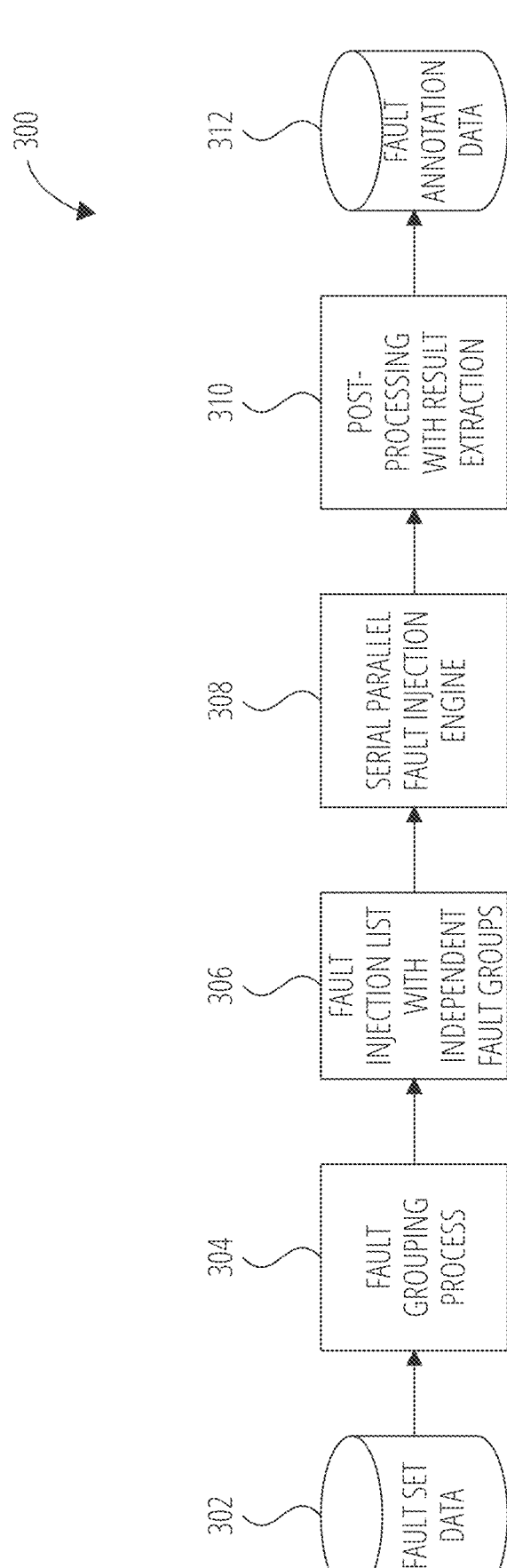
FIG. 3 is a diagram illustrating an example data flow for injecting multiple faults in parallel into a circuit design during fault simulation of the circuit design based on functional independence of the faults, according to some example embodiments.

FIG. 3 is a diagram illustrating an example data flow 300 for injecting multiple faults in parallel into a circuit design during fault simulation of the circuit design based on functional independence of the faults, according to some example embodiments. The data flow 300 begins with fault set data 302, which stores information regarding a set of faults to be analyzed with respect to the circuit design. The fault set data 302 can serve as the input for a fault grouping process 304. The fault grouping process 304 uses structural analysis, which can include one or more of COI analysis, activatability analysis, and propagatability analysis, to determine a set of independent fault groups. In particular, the fault grouping process 304 can determine (e.g., identify) faults that can be injected in parallel without interference, which can be used to determine (e.g., generate) independent fault groups. This can be represented by a fault injection list with independent fault groups 306.

The fault injection list with independent fault groups 306 can represent a run list for serially performing one or more fault simulation runs. Based on the fault injection list with independent fault groups 306, a serial parallel fault injection engine 308 performs a single fault simulation run for each individual independent fault group. For a given independent fault group, the serial parallel fault injection engine 308 performs a fault simulation run for the given independent fault group and injects all faults in the given independent fault group in parallel during the fault simulation run. As described herein, all faults in a given independent fault group can be injected in parallel during a fault simulation run while each individual fault (of the independent fault group) remains independently observable by a subset of strobes (of the set of strobes) associated with the individual fault. During a given fault simulation run for a given independent fault group, observation of individual faults from the given independent fault group at strobes associated with the individual faults. As described herein, the given simulation run can be configured to terminate only after each select fault of the given independent fault group is observed at at least one strobe of an associated subset of strobes (of the set of strobes) associated with the select fault. Overall, the use of independent fault groups can reduce the number of fault simulation runs performed (as multiple faults within independent fault groups can be tested simultaneously).

Eventually, a post-processing with result extraction 310 is performed on one or more results from the one or more fault simulation runs (performed by the serial parallel fault injection engine 308). The post-processing 310 can comprise analyzing the one or more fault simulation run results to extract relevant data, where the extracted data can comprise one or more fault annotations. Each fault annotation can describe whether a fault can be observed at associated strobes during a fault simulation run. The one or more fault simulations (from the extracted data) is stored as fault annotation data 312. As described herein, one or more fault simulations of the fault annotation data 312 can provide (e.g., a user, such as a circuit designer or a safety engineer) insights into the effectiveness of the fault simulations runs and can be used to make informed decisions about potential modifications to the circuit design.

Figure 4:
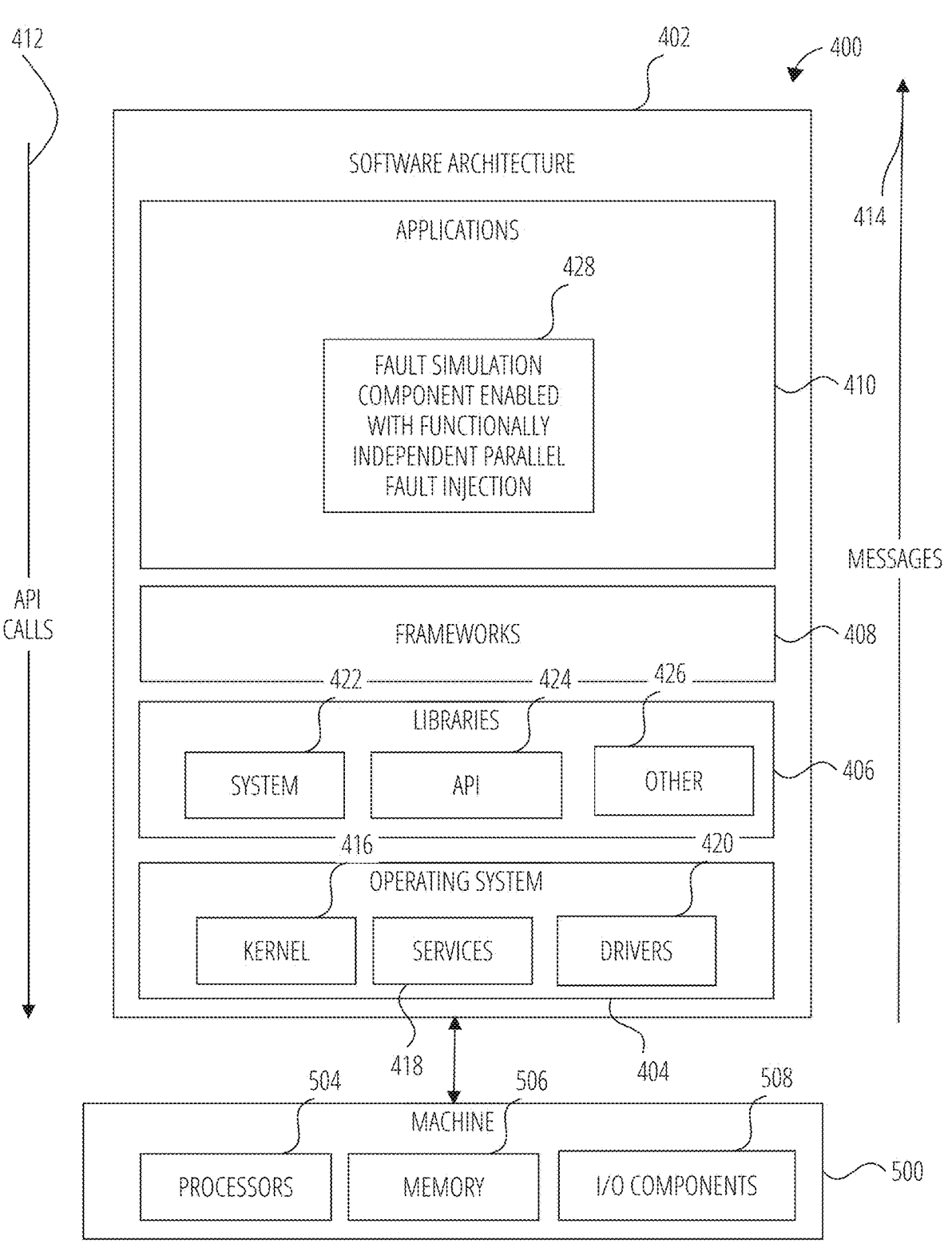
FIG. 4 is a block diagram illustrating an example of a software architecture that may be operating on an electronic design automation (EDA) computing device and may be used with methodologies for injecting multiple faults in parallel into a circuit design during fault simulation of the circuit design based on functional independence of the faults, according to some example embodiments.

FIG. 4 is a block diagram 400 illustrating merely a non-limiting example of a software architecture 402, which can be installed on any one or more of the devices described herein, and it will be appreciated that many other architectures can be implemented to facilitate the functionality described herein. In various example embodiments, the software architecture 402 is implemented by hardware such as a machine 500 that includes processors 504, memory 506, and I/O components 508. In this example, the software architecture 402 can be conceptualized as a stack of layers, where each layer provides a particular functionality. The software architecture 402 includes layers such as an operating system 404, libraries 406, frameworks 408, and applications 410. Operationally, the applications 410 invoke API calls 412 through the software stack and receive messages 414 in response to the API calls 412, consistent with some example embodiments. In various example embodiments, any client device, any server computer of a server system, or any other device described herein may operate using elements of the software architecture 402.

In some example embodiments, a fault simulation component 428 of the applications 410 injects multiple faults in parallel during fault simulation of a circuit design based on functional independence of the faults according to some example embodiments described herein using various components within the software architecture 402. For example, in some example embodiments, a computing device similar to the machine 500 includes the memory 506 and the one or more processors 504. The processors 504 also implement fault simulation component 428 for parallel injection of multiple faults during fault simulation of a circuit design based on functional independence of the faults in accordance with various example embodiments described herein.

In various other embodiments, rather than being implemented as components of the one or more applications 410, the fault simulation component 428 may be implemented using elements of the libraries 406, the operating system 404, or the software frameworks 408.

In various implementations, the operating system 404 manages hardware resources and provides common services. The operating system 404 includes, for example, a kernel 416, services 418, and drivers 420. The kernel 416 acts as an abstraction layer between the hardware and the other software layers. For example, the kernel 416 provides memory management, processor management (e.g., scheduling), component management, networking, and security settings, among other functionalities. The services 418 can provide other common services for the other software layers. The drivers 420 are responsible for controlling or interfacing with the underlying hardware. For instance, the drivers 420 can include display drivers, camera drivers, BLUETOOTH® or BLUETOOTH® Low Energy drivers, flash memory drivers, serial communication drivers (e.g., USB drivers), WI-FI® drivers, audio drivers, power management drivers, and so forth.

In some example embodiments, the libraries 406 provide a common low-level infrastructure used by the applications 410. The libraries 406 can include system libraries 422 (e.g., C standard library) that provide functions such as memory allocation functions, string manipulation functions, mathematic functions, and the like. In addition, the libraries 406 can include API libraries 424 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 406 can also include a wide variety of other libraries 426 to provide many other APIs to the applications 410.

The frameworks 408 provide a common high-level infrastructure that is used by the applications 410. For example, the frameworks 408 provide various graphical user interface (GUI) functions, high-level resource management, and high-level location services. The frameworks 408 can provide a broad spectrum of other APIs that can be used by the applications 410, some of which may be specific to a particular operating system or platform. In various example embodiments, the systems, methods, devices, and instructions described herein may use various files, macros, libraries, and other elements of a safety analysis (e.g., safety analysis or FSV), circuit design, or EDA environment to implement injection of multiple faults in parallel during fault simulation of a circuit design based on functional independence of the faults as described herein. This includes analysis of input design files for an integrated circuit design, along with any element of circuit design that may be used as part of or along with the embodiments described herein. While netlist files, library files, SDC files, and view definition files are examples that may operate within the software architecture 402, it will be apparent that other files and structures may provide a similar function, in various example embodiments.

Certain embodiments are described herein as including logic or a number of components, modules, elements, or mechanisms. Such components can constitute either software components (e.g., code embodied on a machine-readable medium or in a transmission signal) or hardware components. A "hardware component" is a tangible unit capable of performing certain operations and can be configured or arranged in a certain physical manner. In various example embodiments, one or more computer systems (e.g., a standalone computer system, a client computer system, or a server computer system) or one or more hardware components of a computer system (e.g., a processor or a group of processors) are configured by software (e.g., an application or application portion) as a hardware component that operates to perform certain operations as described herein.

In some example embodiments, a hardware component is implemented mechanically, electronically, or any suitable combination thereof. For example, a hardware component can include dedicated circuitry or logic that is permanently configured to perform certain operations. For example, a hardware component can be a special-purpose processor, such as a field-programmable gate array (FPGA) or an application-specific integrated circuit (ASIC). A hardware component may also include programmable logic or circuitry that is temporarily configured by software to perform certain operations. For example, a hardware component can include software encompassed within a general-purpose processor or other programmable processor. It will be appreciated that the decision to implement a hardware component mechanically, in dedicated and permanently configured circuitry, or in temporarily configured circuitry (e.g., configured by software) can be driven by cost and time considerations.

Figure 5:
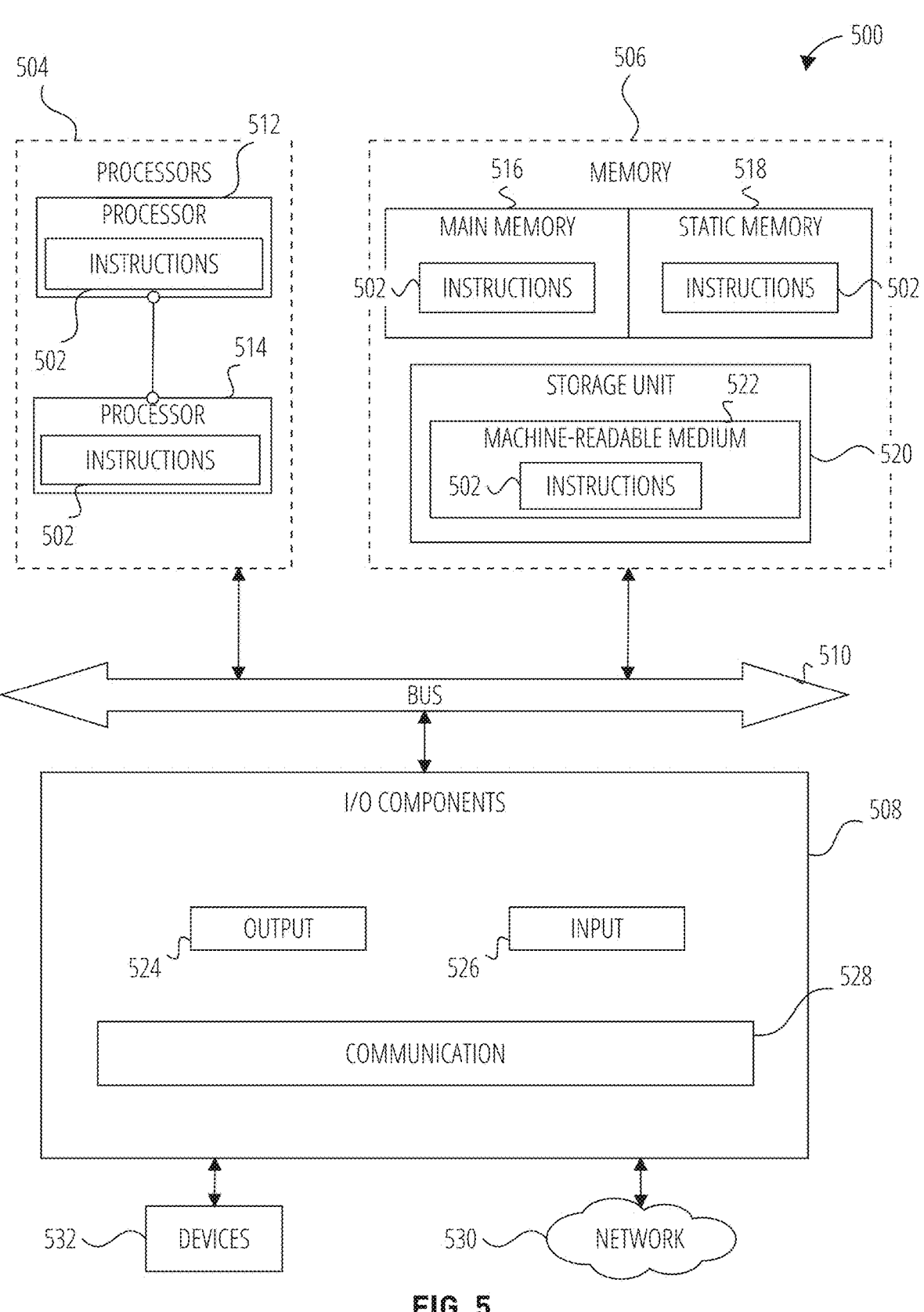
FIG. 5 is a diagrammatic representation of a machine in the form of a computer system within which a set of instructions may be executed to cause the machine to perform any one or more of the methodologies discussed herein, in accordance with some example embodiments.

FIG. 5 is a diagrammatic representation of the machine 500 in the form of a computer system within which a set of instructions may be executed to cause the machine 500 to perform any one or more of the methodologies discussed herein, according to some example embodiments. FIG. 5 shows components of the machine 500, which is, according to some example embodiments, able to read instructions from a machine-readable medium (e.g., a machine-readable storage medium) and perform any one or more of the methodologies discussed herein. Specifically, FIG. 5 shows a diagrammatic representation of the machine 500 in the example form of a computer system, within which instructions 502 (e.g., software, a program, an application, an applet, an app, or other executable code) cause the machine 500 to perform any one or more of the methodologies discussed herein can be executed. In alternative embodiments, the machine 500 operates as a standalone device or can be coupled (e.g., networked) to other machines. In a networked deployment, the machine 500 may operate in the capacity of a server machine or a client machine in a server-client network environment, or as a peer machine in a peer-to-peer (or distributed) network environment. The machine 500 can comprise, but not be limited to, a server computer, a client computer, a personal computer (PC), a tablet computer, a laptop computer, a netbook, or any machine capable of executing the instructions 502, sequentially or otherwise, that specify actions to be taken by the machine 500. Further, while only a single machine 500 is illustrated, the term "machine" shall also be taken to include a collection of machines 500 that individually or jointly execute the instructions 502 to perform any one or more of the methodologies discussed herein.

In various example embodiments, the machine 500 comprises processors 504, memory 506, and I/O components 508, which can be configured to communicate with each other via a bus 510. In some example embodiments, the processors 504 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 512 and a processor 514 that may execute the instructions 502. The term "processor" is intended to include multi-core processors that can comprise two or more independent processors 512, 514 (also referred to as "cores") that can execute the instructions 502 contemporaneously.

Although FIG. 5 shows multiple processors 504, the machine 500 may include a single processor 512 with a single core, a single processor 512 with multiple cores (e.g., a multi-core processor), multiple processors 504 with a single core, multiple processors 504 with multiple cores, or any combination thereof.

The memory 506 comprises a main memory 516, a static memory 518, and a storage unit 520 accessible to the processors 504 via the bus 510, according to some example embodiments. The storage unit 520 can include a machine-readable medium 522 on which are stored the instructions 502 embodying any one or more of the methodologies or functions described herein. The instructions 502 can also reside, completely or at least partially, within the main memory 516, within the static memory 518, within at least one of the processors 504 (e.g., within the processor's cache memory), or any suitable combination thereof, during execution thereof by the machine 500. Accordingly, in various example embodiments, the main memory 516, the static memory 518, and the processors 504 are considered machine-readable media machine-readable medium 522.

As used herein, the term "memory" refers to a machine-readable medium 522 able to store data temporarily or permanently and may be taken to include, but not be limited to, random-access memory (RAM), read-only memory (ROM), buffer memory, flash memory, and cache memory. While the machine-readable medium 522 is shown, in some example embodiments, to be a single medium, the term "machine-readable medium" should be taken to include a single medium or multiple media (e.g., a centralized or distributed database, or associated caches and servers) able to store the instructions 502. The term "machine-readable medium" shall also be taken to include any medium, or combination of multiple media, that is capable of storing instructions (e.g., the instructions 502) for execution by a machine (e.g., the machine 500), such that the instructions, when executed by one or more processors of the machine (e.g., the processors 504), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 508 include a wide variety of components to receive input, provide output, produce output, transmit information, exchange information, capture measurements, and so on. In general, it will be appreciated that the I/O components 508 can include many other components that are not shown in FIG. 5. The I/O components 508 are grouped according to functionality merely to simplify the following discussion, and the grouping is in no way limiting. In various example embodiments, the I/O components 508 include output components 524 and input components 526. The output components 524 include visual components (e.g., a display (or hardware display) such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 526 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

Communication can be implemented using a wide variety of technologies. The I/O components 508 may include communication components 528 operable to couple the machine 500 to a network 530 or devices 532 via respective couplings. For example, the communication components 528 include a network interface component or another suitable device to interface with the network 530. In further examples, the communication components 528 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 532 may be another machine or any of a wide variety of peripheral devices (e.g., a peripheral device coupled via a USB).

In various example embodiments, one or more portions of the network 530 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 530 or a portion of the network 530 may include a wireless or cellular network.

Furthermore, the machine-readable medium 522 is non-transitory (in other words, not having any transitory signals) in that it does not embody a propagating signal. However, labeling the machine-readable medium 522 "non-transitory" should not be construed to mean that the machine-readable medium 522 is incapable of movement; the machine-readable medium 522 should be considered as being transportable from one physical location to another. Additionally, since the machine-readable medium 522 is tangible, the machine-readable medium 522 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various example embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various example embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various example embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A system comprising:

a memory storing instructions; and a hardware processor communicatively coupled to the memory and configured by the instructions to perform operations comprising:

accessing fault set data describing a set of faults to be analyzed for a circuit design;

accessing strobe data describing a set of strobes for observing the circuit design;

performing a structural analysis of the circuit design to determine, for the set of faults, fault observability per strobe of the set of strobes;

determining, based on a result of the structural analysis, a set of independent fault groups from the set of faults, all faults within each individual independent fault group of the set of independent fault groups being injectable in parallel while each individual fault of the individual independent fault group remains independently observable by a subset of strobes of the set of strobes associated with the individual fault; and performing one or more fault simulation runs serially on the circuit design based on the set of independent fault groups.

2. The system of claim 1, wherein the result of the structural analysis comprises a mapping of each single fault of the set of faults to a single subset of strobes of the set of strobes.

3. The system of claim 1, wherein the performing of the one or more fault simulation runs serially on the circuit design based on the set of independent fault groups comprises:

performing a single fault simulation run on the circuit design for a single independent fault group of the set of independent fault groups, the single fault simulation run comprising:

performing a fault simulation on the circuit design;

injecting in parallel all faults from the single independent fault group while performing the fault simulation on the circuit design; and while injecting all faults from the single independent fault group, detecting for one or more events at a single subset of strobes of the set of strobes, the single subset of strobes being associated with the single independent fault group.

4. The system of claim 3, wherein the operations comprise:

after the single fault simulation is performed on the circuit design, performing a next fault simulation run on the circuit design for a next independent fault group of the set of independent fault groups.

5. The system of claim 3, wherein the performing of the one or more fault simulation runs serially on the circuit design based on the set of independent fault groups generates fault simulation results, and wherein the operations comprise:

extracting a set of fault annotations from the fault simulation results, the set of fault annotations describing whether one or more faults of the set of faults are observed at one or more strobes of the set of strobes during the one or more fault simulation runs.

6. The system of claim 3, wherein the performing of the one or more fault simulation runs serially on the circuit design based on the set of independent fault groups generates fault simulation results, and wherein the operations comprise:

extracting, from the fault simulation results, a set of fault annotations for the single independent fault group, the set of fault annotations describing whether one or more faults from the single independent fault group are observed at one or more strobes of the single subset of strobes during the single fault simulation run.

7. The system of claim 6, wherein the operations comprise:

receiving, from a user, at least one modification to the circuit design based on at least one fault annotation of the set of fault annotations.

8. The system of claim 1, wherein the performing of the one or more fault simulation runs serially on the circuit design based on the set of independent fault groups comprises:

performing a select fault simulation run on the circuit design for each select independent fault group of the set of independent fault groups serially, the select fault simulation run comprising:

performing a fault simulation on the circuit design;

injecting in parallel all faults from the select independent fault group while performing the fault simulation on the circuit design; and while injecting all faults from the select independent fault group, detecting for one or more events at a select subset of strobes of the set of strobes, the select subset of strobes being associated with the select independent fault group.

9. The system of claim 1, wherein a given simulation run for a given independent fault group is configured to terminate only after each select fault of the given independent fault group is observed at at least one strobe of an associated subset of strobes of the set of strobes associated with the select fault.

10. The system of claim 1, wherein the structural analysis comprises at least one of a cone-of-influence (COI) analysis, an activatability analysis, or a propagatability analysis.

11. A non-transitory computer-readable medium comprising instructions that, when executed by a hardware processor of a device, cause the device to perform operations comprising:

accessing fault set data describing a set of faults to be analyzed for a circuit design;

accessing strobe data describing a set of strobes for observing the circuit design;

performing a structural analysis of the circuit design to determine, for the set of faults, fault observability per strobe of the set of strobes;

determining, based on a result of the structural analysis, a set of independent fault groups from the set of faults, all faults within each individual independent fault group of the set of independent fault groups being injectable in parallel while each individual fault of the individual independent fault group remains independently observable by a subset of strobes of the set of strobes associated with the individual fault; and performing one or more fault simulation runs serially on the circuit design based on the set of independent fault groups.

12. The non-transitory computer-readable medium of claim 11, wherein the result of the structural analysis comprises a mapping of each single fault of the set of faults to a single subset of strobes of the set of strobes.

13. The non-transitory computer-readable medium of claim 11, wherein the performing of the one or more fault simulation runs serially on the circuit design based on the set of independent fault groups comprises:

performing a single fault simulation run on the circuit design for a single independent fault group of the set of independent fault groups, the single fault simulation run comprising:

performing a fault simulation on the circuit design;

injecting in parallel all faults from the single independent fault group while performing the fault simulation on the circuit design; and while injecting all faults from the single independent fault group, detecting for one or more faults at a single subset of strobes of the set of strobes, the single subset of strobes being associated with the single independent fault group.

14. The non-transitory computer-readable medium of claim 13, wherein the operations comprise:

after the single fault simulation is performed on the circuit design, performing a next fault simulation run on the circuit design for a next independent fault group of the set of independent fault groups.

15. The non-transitory computer-readable medium of claim 13, wherein the performing of the one or more fault simulation runs serially on the circuit design based on the set of independent fault groups generates fault simulation results, and wherein the operations comprise:

extracting a set of fault annotations from the fault simulation results, the set of fault annotations describing whether one or more faults of the set of faults are observed at one or more strobes of the set of strobes during the one or more fault simulation runs.

16. The non-transitory computer-readable medium of claim 13, wherein the performing of the one or more fault simulation runs serially on the circuit design based on the set of independent fault groups generates fault simulation results, and wherein the operations comprise:

extracting, from the fault simulation results, a set of fault annotations for the single independent fault group, the set of fault annotations describing whether one or more faults from the single independent fault group are observed at one or more strobes of the single subset of strobes during the single fault simulation run.

17. The non-transitory computer-readable medium of claim 16, wherein the operations comprise:

receiving, from a user, at least one modification to the circuit design based on at least one fault annotation of the set of fault annotations.

18. The non-transitory computer-readable medium of claim 11, wherein the performing of the one or more fault simulation runs serially on the circuit design based on the set of independent fault groups comprises:

performing a select fault simulation run on the circuit design for each select independent fault group of the set of independent fault groups serially, the select fault simulation run comprising:

performing a fault simulation on the circuit design;

injecting in parallel all faults from the select independent fault group while performing the fault simulation on the circuit design; and while injecting all faults from the select independent fault group, detecting for one or more events at a select subset of strobes of the set of strobes, the select subset of strobes being associated with the select independent fault group.

19. The non-transitory computer-readable medium of claim 11, a given simulation run for a given independent fault group is configured to terminate only after each select fault of the given independent fault group is observed at at least one strobe of an associated subset of strobes of the set of strobes associated with the select fault.

20. A method comprising:

accessing, by a hardware processor, fault set data describing a set of faults to be analyzed for a circuit design;

accessing, by the hardware processor, strobe data describing a set of strobes for observing the circuit design;

performing, by the hardware processor, a structural analysis of the circuit design to determine, for the set of faults, fault observability per strobe of the set of strobes;

determining, by the hardware processor and based on a result of the structural analysis, a set of independent fault groups from the set of faults, all faults within each individual independent fault group of the set of independent fault groups being injectable in parallel while each individual fault of the individual independent fault group remains independently observable by a subset of strobes of the set of strobes associated with the individual fault; and performing, by the hardware processor, one or more fault simulation runs serially on the circuit design based on the set of independent fault groups.

\* \* \* \* \*